(12) United States Patent
Chen

(10) Patent No.: US 10,008,464 B2
(45) Date of Patent: Jun. 26, 2018

(54) SMART BGA CHIP MAINTENANCE DEVICE

(71) Applicant: Jingyan Instruments & Technology Co., Ltd., Dongguan, Guangdong (CN)

(72) Inventor: Guosheng Chen, Fujian (CN)

(73) Assignee: Jingyan Instruments & Technology Co., Ltd. (CN)

(*) Notice: Subject to any disclaimer, the term of this patent is extended or adjusted under 35 U.S.C. 154(b) by 12 days.

(21) Appl. No.: 15/295,609

(22) Filed: Oct. 17, 2016

(65) Prior Publication Data
US 2017/0330849 A1 Nov. 16, 2017

(30) Foreign Application Priority Data
May 12, 2016 (CN) .................... 2016 2 0424888 U

(51) Int. Cl.
| | |
|---|---|
| B24B 49/12 | (2006.01) |
| H01L 23/00 | (2006.01) |
| B24B 47/02 | (2006.01) |
| B24B 51/00 | (2006.01) |

(52) U.S. Cl.
CPC .............. *H01L 24/11* (2013.01); *B24B 47/02* (2013.01); *B24B 49/12* (2013.01); *B24B 51/00* (2013.01); *H01L 2224/1184* (2013.01)

(58) Field of Classification Search
CPC ......... B24B 47/00; B24B 47/02; B24B 49/04; B24B 49/045; B24B 49/12; B24B 49/16; B24B 55/06
See application file for complete search history.

(56) References Cited

U.S. PATENT DOCUMENTS

| | | | | |
|---|---|---|---|---|
| 4,705,016 | A * | 11/1987 | Sekiya | B23D 59/002 125/13.01 |
| 5,355,755 | A * | 10/1994 | Sakata | B24B 1/04 451/165 |
| 5,560,743 | A * | 10/1996 | Imayama | B08B 5/02 451/2 |
| 6,726,526 | B2 * | 4/2004 | Sekiya | B28D 5/0082 125/13.01 |
| 8,235,773 | B2 * | 8/2012 | Yin | B23Q 11/0046 451/451 |
| 9,508,570 | B2 * | 11/2016 | Cheng | B28D 5/024 |
| 9,673,070 | B2 * | 6/2017 | Katagiri | H01L 21/67092 |
| 2008/0085662 | A1 * | 4/2008 | Sekiya | B24B 7/228 451/59 |
| 2016/0207158 | A1 * | 7/2016 | Fukui | B24B 5/01 |

* cited by examiner

*Primary Examiner* — Timothy V Eley

(57) ABSTRACT

The present invention relates to a smart BGA chip maintenance device comprising a base, a moving worktable, a horizontal slide, a vertical slide, a grinding knife, an electronic microscope and a mini-sized air compressor, wherein the base comprises a platform and a portal frame. The moving worktable is propelled by a first driving mechanism, wherein the horizontal slide is propelled by a second driving mechanism, wherein the vertical slide is propelled by a third driving mechanism. Both a grinding knife and an electronic microscope are provided on the vertical slide. An air pipe is disposed at the side of the grinding knife, wherein the grinding knife is propelled by a fourth driving mechanism to rotate, wherein the device can automatically perceive the flatness of the chip, ensuring a horizontal grinding process and avoiding the damage to the soldering pad of the circuit board.

10 Claims, 2 Drawing Sheets

SMART BGA CHIP MAINTENANCE DEVICE

TECHNICAL FIELD OF THE INVENTION

The present invention relates to the technical field of maintenance devices, and more particularly, to a smart BGA chip maintenance device.

BACKGROUND OF THE INVENTION

With the development of integrated technology, the use of deep sub-micron technology, such as LSI, VLSI, and ULSI, is becoming more prevalent. Consequently, the integration level of the silicon single chip has been improved continuously, resulting in stricter requirements of the integrated circuit package. In addition to the constant increase of I/O pins quantity, power consumption has been increased accordingly. In order to satisfy these requirements, a new package, which is named Ball Grid Array Package (BGA), has been developed on the basis of the traditional art. The I/O terminals of the BGA package are distributed underneath the package in circular or columnar soldering point arrays. Due to the particularity of the package, a high-standard soldering technology is required. However, during production and maintenance, due to the damage of the BGA, among other reasons, the package must be replaced often. During the replacement process, the disassembly of the BGA can be regarded as a reverse process of soldering the BGA. A professional soldering plant usually adopts the heating method, sucking the BGA by a vacuum suction pen after raising the temperature. Yet presently the electronic equipment must decrease in size due to the smaller size of the circuit board—which has nevertheless become more complex due to the added layers. For instance, the circuit board of a mobile phone normally adopts a six-layered board, which has more than seven BGA chips and a large number of electronic parts and components around the chips. Once damaged, the chips simply cannot be replaced by a heating method, and the multi-layered board can easily be distorted by the high temperature, resulting in the decrease of the electrical performance due to the circuit damage. Even worse, the high temperature may lead to damage or displacement of other components and parts. In such case, to prevent the soldering pad from being damaged by an excessive force, other assistant tools (e.g. a tweezers) cannot be utilized to disassemble the BGA, turning the maintenance of the BGA circuit board into an extremely difficult job. In order to reduce the manufacturing cost and decrease the damage rate of the circuit boards, the prior art utilized to grind off the damaged BGA chips during the maintenance of the circuit board. Although the prior art can protect the circuit board and save significant costs associated with creating a dust-free workshop and heating process, the process disclosed in the prior art is difficult to master, inefficient, and has a high failure rate.

SUMMARY OF THE INVENTION

The purpose of the present invention is to overcome the shortcomings of the prior art and provide a smart BGA chip maintenance device, which can solve the problems relating to a protracted grinding period and high failure rate of the prior grinder.

To achieve the above purpose, the present invention adopts the following technical solution:

A smart BGA chip maintenance device comprising a base, a moving worktable, a horizontal slide, a vertical slide, a grinding knife, an electronic microscope and a mini-sized air compressor. The base comprises a platform and a portal frame which is disposed on the platform. The moving worktable, which is propelled by a first driving mechanism to move front and back, is disposed on the platform. The horizontal slide, which is propelled by a second driving mechanism to move left and right, is disposed on the portal frame. The second driving mechanism is disposed on the portal frame. The vertical slide, which is propelled by a third driving mechanism to move up and down, is disposed on the horizontal slide. The third driving mechanism is disposed on the horizontal slide. Both a grinding knife and an electronic microscope are provided on the vertical slide. The electronic microscope is disposed at the side of the grinding knife, where an air pipe is also disposed. The grinding knife is propelled by a fourth driving mechanism to rotate. A mini-sized air compressor is disposed at the side of the base. The mini-sized air compressor is connected to the air pipe.

Preferably, an illuminating light is disposed on the vertical slide. The illuminating light is disposed at the side of the grinding knife. A switch turning the illuminating light on/off is disposed on the base.

In another preferred embodiment of the present invention, a first linear guide is disposed in the platform. The moving worktable moves front and back along the first linear guide. The first driving mechanism comprises a first motor and a first ball screw. The first motor propels the moving worktable to move front and back through the first ball screw.

Preferably, the quantity of the first linear guide is two. The two first linear guides are both square ball linear guides. The first ball screw, which is a Hiwin ball screw, is disposed between the two first linear guides.

In another embodiment, a second linear guide is disposed on the portal frame. The horizontal slide moves left and right along the second linear guide. The second driving mechanism comprises a second motor and a second ball screw. The second motor propels the horizontal slide to move left and right through the second ball screw.

In another embodiment, the quantity of the second linear guide is two. The two second linear guides are both square ball linear guides. The second ball screw, which is a Hiwin ball screw, is disposed between the two second linear guides.

Preferably, a third linear guide is disposed on the horizontal slide. The vertical slide moves up and down along the third linear guide. The third driving mechanism comprises a third motor and a third ball screw. The third motor propels the vertical slide to move up and down through the third ball screw.

In another embodiment, there are two third linear guides, which are both square ball linear guides. The third ball screw, which is a Hiwin ball screw, is disposed between the two third linear guides.

In another preferred embodiment, the fourth driving mechanism is a motor.

In another embodiment, a pressure sensor, which is disposed on the platform, is placed underneath the moving worktable. A touch panel and an emergency stop button are provided at the front side of the platform. The emergency stop button is disposed at the side of the touch panel. A display screen, which is disposed on the portal frame, is connected to the electronic microscope.

Compared with the prior art, the present invention has the following advantages:

The maintenance device of the present invention can automatically perceive the flatness of the chip, ensuring a horizontal grinding process and avoiding damage to the soldering pad of the circuit board. The device can also automatically program a grinding route according to the chip size, making the grinding process more efficient and less complicated. Moreover, the device can store the data information of one hundred chips, and the records can conveniently be accessed at any time. The human-centered design of the touch interface allows an intelligent operation without computer assistance. Furthermore, the electronic microscope can monitor and display the grinding process in real-time.

BRIEF DESCRIPTION OF THE DRAWINGS

To clearly expound the present invention or technical solution, the drawings and embodiments are hereinafter combined to illustrate the present invention. Obviously, the drawings are merely some embodiments of the present invention and those skilled in the art can associate themselves with other drawings without paying creative labor.

MARKING INSTRUCTIONS OF THE DRAWINGS

10. Base, 11. Platform, 12. Portal Frame, 21. Moving Worktable, 22. Horizontal Slide, 23. Vertical Slide, 24. Grinding knife, 25. Electronic microscope, 26. Mini-sized Air Compressor, 27. Air Pipe, 28. Illuminating Light, 29. Display Screen, 31. The First Linear Guide, 32. The Second Linear Guide, 33. The Third Linear Guide, 40. The Second Driving Mechanism, 41. The Second Motor. 42. The Second Ball Screw, 50. The Third Driving Mechanism, 51. The Third Motor, 52. The Third Ball Screw, 60. The Fourth Driving Mechanism, 101. Illuminating Light Switch, 102. Touch panel, 103. Emergency Stop Button

DETAILED DESCRIPTION OF THE INVENTION

Drawings and detailed embodiments are combined hereinafter to elaborate the technical principles of the present invention.

Figure 1:
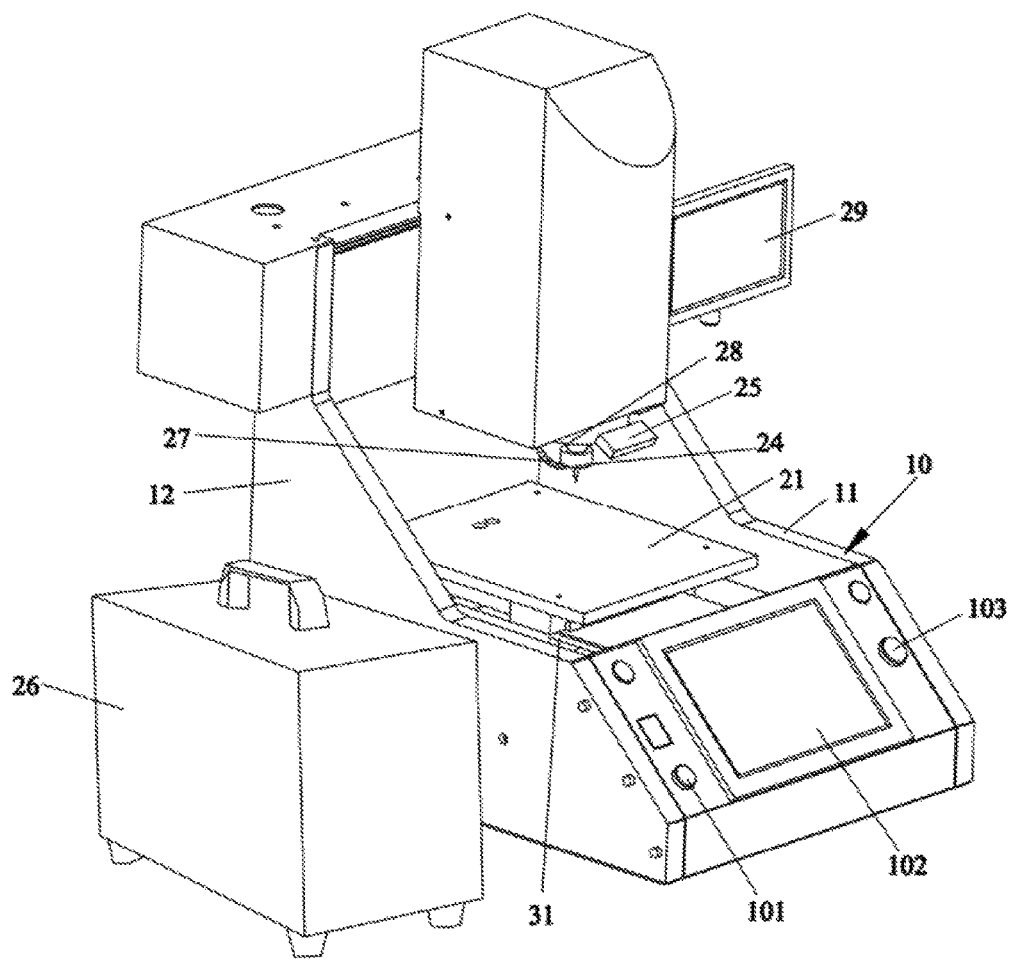
FIG. 1 is a three-dimensional diagram of a preferred embodiment of the present invention.
Figure 2:
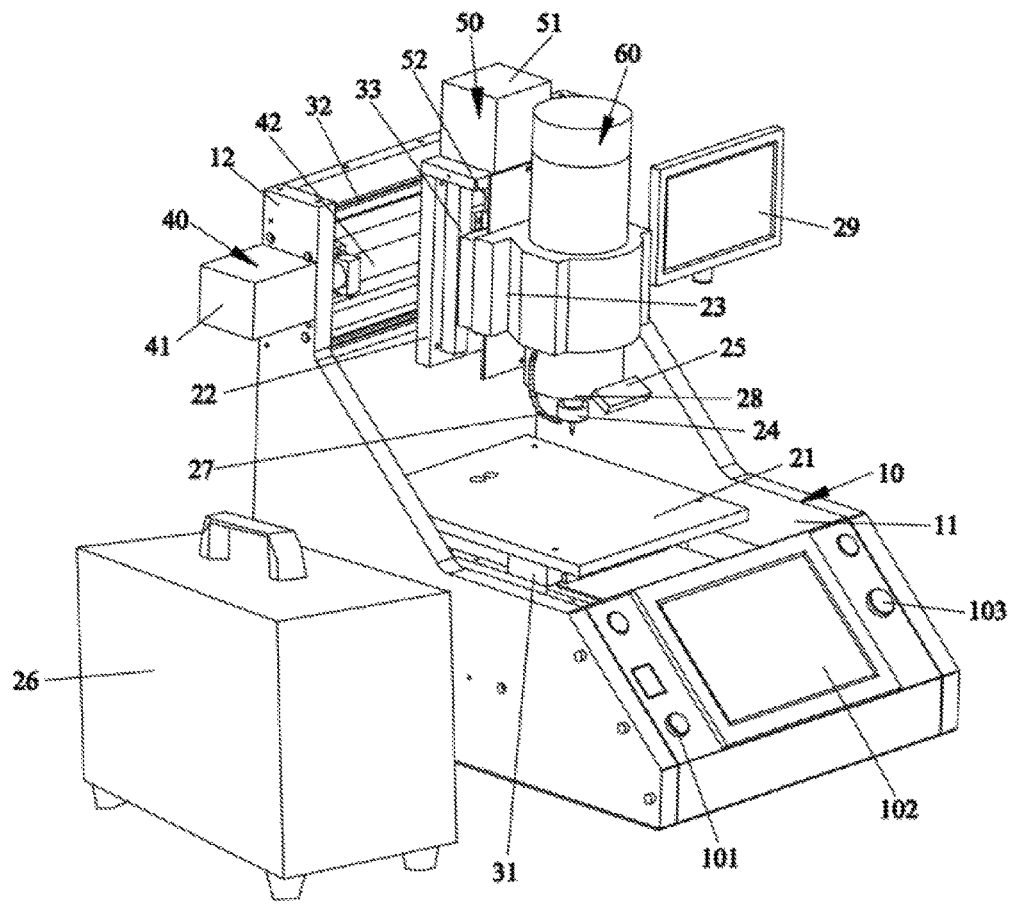
FIG. 2 is another three-dimensional diagram of a preferred embodiment of the present invention.

As shown in FIGS. 1-2, the detailed structure of a preferred embodiment of the present invention comprising a base 10, a moving worktable 21, a horizontal slide 22, a vertical slide 23, a grinding knife 24, an electronic microscope 25 and a mini-sized air compressor 26.

The base 10 comprises a platform 11 and a portal frame 12 which is disposed on the platform 11.

The moving worktable 21, which can move front and back, is disposed on the platform 11. The moving worktable 21 is propelled by a first driving mechanism (not shown in the drawing) to move front and back. Specifically, in this embodiment, a first linear guide 31 is disposed in the platform, and the moving worktable 21 moves front and back along the first linear guide 31. The first driving mechanism comprises a first motor and a first ball screw. The first motor propels the moving worktable 21 to move front and back through the first ball screw. There are two first linear guides 31, which are both square ball linear guides. The first ball screw, which is a Hiwin ball screw, is disposed between the two first linear guides 31.

A horizontal slide 22, which can move left and right, is disposed on the portal frame 12. The horizontal slide 22 is propelled by the second driving mechanism 40 to move left and right. The second driving mechanism 40 is disposed on the portal frame 12. Specifically, in this embodiment, a second linear guide 32 is disposed on the portal frame 12. The horizontal slide 22 moves left and right along the second linear guide 32. The second driving mechanism 40 comprises a second motor 41 and a second ball screw 42. The second motor 41 propels the horizontal slide 22 to move left and right through the second ball screw 42. Additionally, there are two second linear guides 32, which are both square ball linear guides. And, the second ball screw 42, which is a Hiwin ball screw, is disposed between the two second linear guides 32.

A vertical slide 23, which can move up and down, is disposed on the horizontal slide 22. The vertical slide 23 is propelled by a third driving mechanism 50 to move up and down. The third driving mechanism 50 is disposed on the horizontal slide 22. Specifically, in the preferred embodiment, a third linear guide 33 is disposed on the horizontal slide 22. The vertical slide 23 moves up and down along the third linear guide. The third driving mechanism 50 comprises a third motor 51 and a third ball screw 52. The third motor 51 is propelled by the third ball screw 52 to move up and down. Moreover, there are two third linear guides, which are both square ball linear guides. And, the third ball screw 52, which is a Hiwin ball screw, is disposed between the two third linear guides 33.

A grinding knife 24 and an electronic microscope 25 are provided on the vertical slide 23. The electronic microscope 25 is disposed at the side of the grinding knife 24 so as to conveniently monitor the grinding status. An air pipe 27 is disposed at the side of the grinding knife 24. The grinding knife 24 is propelled by a fourth driving mechanism to rotate. In this embodiment, the fourth driving mechanism 60 is a motor, and more particularly, is a high-speed grinding motor, of which the frequency is 400 Hz.

The mini-sized air compressor 26, which is disposed at the side of the base 10, is connected to the air pipe 27.

Furthermore, an illuminating light 28, which is disposed on the vertical slide 23, is placed at the side of the grinding knife 24. The illuminating light 28 is an annular-shaped LED light. A switch turning the illuminating light on/off of the illuminating light 28 is disposed on the base. Additionally, a pressure sensor (not shown in the drawing), which is disposed underneath the platform 11, is placed underneath the moving worktable 21, enabling the platform 11 to automatically move backward when meeting an obstacle. A touch panel 102 and an emergency stop button 103 are disposed at the front side of the platform 11. The emergency stop button 103 is disposed at the side of the touch panel 102. A display screen 29, which is disposed on the portal frame 12, is also connected to the electronic microscope 25.

When the device is initiated, it can move the X, Y, and Z axis to the mechanical origin, ensuring a zero position.

Subsequently, by tapping the "Feeding" button, the platform of Y-axis automatically moves forward, enabling an operator to easily place the circuit board waiting for treatment on the template. (Note: to realize easy Y-axis movement, a rectangle clearance is disposed on the metal sheet of the housing, which is dangerous for a finger or foreign object to enter into. The present invention utilizes a pressure sensor to realize an anti-pinch function. When the pressure sensor perceives an abnormal pressure in the moving direction of Y-axis, the platform of Y-axis can move backward and the device can be stopped accordingly. Thus, unnecessary damage can be avoided.)

Subsequently, the coordinate position of the BGA chip waiting for treatment is set (the coordinate only needs to be inputted in the upper right corner of the chip), then the size and thickness of the chip is inputted, and the rotating speed of the grinding motor is regulated (the rotating speed of the grinding motor can be regulated, and the highest speed is 400 Hz).

After setting the parameters, a processing mode can be chosen according to the various sizes and materials of the chips. For instance, when grinding the surface, it's better to choose a rough processing mode because the grinding speed can be fast, and the processing depth and times can be regulated by an operator; whereas when one is grinding near the soldering pad, a finish processing mode should be chosen. To protect the soldering pad, the processing speed and thickness should be reduced so as to prevent the soldering pad from being damaged near the end of the grinding process. Sometimes the distortion of the circuit board can lead to some low-lying points, which can be solved by setting a compensated area, namely, re-processing the selected area.

Subsequently, annular processing mode or parallel processing mode according to the various sizes of the chips is selected (Note: more processing modes can be added here but the present invention temporarily has these two.)

After setting all of the parameters, by pressing the "Running" button, the system starts to detect the plane of the chip according to the preset value, and the pressure sensor returns to zero. First, the grinding motor moves to a preset coordinate position, then moves inward 0.2 mm, ensuring the knife point of the grinding knife makes contact with the surface. Subsequently, the grinding motor moves down from the fixed position; and the knife point has reached the chip when the pressure sensor detects that the pressure has reached 100 g. However, it doesn't mean that the knife point has just reached the chip. Therefore, the motor moves up in a extremely low speed until the pressure sensor perceives that the pressure is decreased from 100 g to 10 g, meaning that the knife point has just reached the chip surface (avoiding the inaccuracy caused by an artificial judgement of the surface and ensuring the precision of the grinding depth). The other three corners can also be detected by the same method (the detecting point can be added according to the actual requirement, which can obtain detailed status of the chip surface). The the system can then calculate the actual status of the chip surface and the inclined angle according to the descending distance of the four points. The system can incorporate the setting parameters and automatically generate a program of the grinding route without manual programming, which enables a user to export and customize the program.

Once the program is generated by the system, the automatic grinding process begins and the dust-collection function can be automatically initiated, collecting the dust produced in the grinding process. The dust collector can be automatically stopped when the grinding process is finished.

During the process, the system can monitor the pressure sensor in a real-time. When the grinding pressure is higher than 200 g, the system can automatically suggest that the user replace the grinding knife, which has worn down due to excessive pressure. The user can tap the "Replacing" button to replace the worn grinding knife at mid-point, and the new grinding knife can follow the previous position to continue grinding, ensuring the continuity and quality of the grinding process. (Note: the grinding process is monitored by the pressure sensor. Once the grinding process is disturbed by an abnormal external force, the pressure sensor alarm sounds, stopping the device, thereby protecting the operator and the device from being damaged. This function is same as the anti-pinch function.)

After the completion of the grinding process, the user can use the electronic microscope to check the pin points of the soldering pad on the display screen. Meanwhile, the system can automatically detect according to the setting parameters.

Once the grinding process is implemented and the detecting result is verified, the user can store the parameters in a SD card for future reference—when grinding a circuit board chip with the same dimensions, the user can merely open the stored data in the SD card and tap the "Start-up" button, and the program can automatically start to work without adjusting any settings. The process is thus fully automated.

Furthermore, the dust-collecting function of the mini-sized air compressor is specially designed, which can be switched into a blowing function. When debris needs to be cleared, the user can merely press down the switch button and the dust collector can function as a blowing gun.

The above description combined with detailed embodiment to elaborate the technical principles of the invention. The description is intended to illustrate, but not to limit the protective scope of the invention in any way. Based on the detailed description herein, those skilled in the art can associate themselves with other particular embodiments without paying creative labor. Thus, these embodiments shall fall into the protective scope of the invention.

The invention claimed is:

1. A smart BGA chip maintenance device, comprising:
   a base,
   a worktable,
   a horizontal slide,
   a vertical slide,
   a knife,
   an electronic microscope, and
   a mini-sized air compressor,
   wherein the base comprises a platform and a portal frame which is disposed on the platform; wherein the worktable, is capable of being propelled by a first driving mechanism to move horizontally, wherein the worktable is disposed on the platform; wherein the horizontal slide is capable of being propelled by a second driving mechanism to move horizontally, wherein the horizontal slide is disposed on the portal frame; wherein the second driving mechanism is disposed on the portal frame; wherein the vertical slide is capable of being propelled by a third driving mechanism to move vertically, wherein the vertical slide is disposed on the horizontal slide; wherein the third driving mechanism is disposed on the horizontal slide; wherein the knife and an electronic microscope are provided on the vertical slide, wherein the electronic microscope is disposed at a side of the knife, where an air pipe is also disclosed, wherein the knife is propelled by a fourth driving mechanism to rotate, wherein a mini-sized air compressor, which is disposed at a side of the base, is connected to the air pipe.

2. The smart BGA chip maintenance device of claim 1, wherein an illuminating light is disposed on the vertical slide, wherein the illuminating light is placed at the side of the knife, wherein a switch turning is disposed on the base to turn the illuminating light on and off.

3. The smart BGA chip maintenance device of claim 1, wherein a first linear guide is disposed in the platform; wherein the moving worktable moves front and back along the first linear guide; wherein the first driving mechanism comprises a first motor and a first ball screw, wherein the first motor propels the moving worktable to move front and back through the first ball screw.

4. The smart BGA chip maintenance device of claim 3, further comprises two first linear guides, wherein the two first linear guides are both square ball linear guides; wherein the first ball screw, which is a Hiwin ball screw, is disposed between the two first linear guides.

5. The smart BGA chip maintenance device of claim 3, wherein a second linear guide is disposed on the portal frame, wherein the horizontal slide moves left and right along the second linear guide, wherein the second driving mechanism comprises a second motor and a second ball screw, wherein the second motor propels the horizontal slide to move left and right through the second ball screw.

6. The smart BGA chip maintenance device of claim 5, wherein the quantity of the second linear guide is two, wherein the two second linear guides are both square ball linear guides, wherein the second ball screw, which is a Hiwin ball screw, is disposed between the two second linear guides.

7. The smart BGA chip maintenance device of claim 5, wherein a third linear guide is disposed on the horizontal slide, wherein the vertical slide moves up and down along the third linear guide, wherein the third driving mechanism comprises a third motor and a third ball screw, wherein the third motor propels the vertical slide to move up and down through the third ball screw.

8. The smart BGA chip maintenance device of claim 7, wherein there are two third linear guides, wherein the two third linear guides are both square ball linear guides; wherein the third ball screw, which is a Hiwin ball screw, is disposed between the two third linear guides.

9. The smart BGA chip maintenance device of claim 1, wherein the fourth driving mechanism is a motor.

10. The smart BGA chip maintenance device of claim 1, wherein a pressure sensor, which is disposed on the platform, is placed underneath the moving worktable, wherein a touch panel and an emergency stop button are disposed at a front side of the platform, wherein the emergency stop button is disposed at a side of the touch panel, wherein a display screen, which is disposed on the portal frame, is connected to the electronic microscope.

* * * * *